(12) United States Patent
Ma et al.

(10) Patent No.: US 6,747,523 B1
(45) Date of Patent: Jun. 8, 2004

(54) BIFET VOLTAGE CONTROLLED OSCILLATOR

(75) Inventors: Pingxi Ma, Irvine, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/324,341

(22) Filed: Dec. 19, 2002

(51) Int. Cl.[7] .................................. H03B 5/12
(52) U.S. Cl. .......................... 331/177 V; 331/117 FE
(58) Field of Search .................. 331/177 V, 117 R, 331/115, 36 C, 117 FE

(56) References Cited

U.S. PATENT DOCUMENTS 6,317,008 B1 * 11/2001 Gabara ................ 331/117 R
6,411,171 B2 * 6/2002 Itoh .......................... 331/117 R
2002/0014925 A1 * 2/2002 Ochiai .................. 331/117 FE

* cited by examiner

*Primary Examiner*—Robert Poscal
*Assistant Examiner*—Joseph Chang
(74) *Attorney, Agent, or Firm*—Farjami & Farjami LLP

(57) ABSTRACT

According to one exemplary embodiment, a VCO core circuit is connected across a first node and a second node. The anode of a first varactor is connected to the first node while the anode of a second varactor is connected to the second node, and the cathode of the first varactor is tied to the cathode of the second varactor. A tuning voltage is also connected to the cathode of the first varactor and the cathode of the second varactor. The inductor is connected across the first node and the second node. A first and second bipolar transistors are configured as a differential pair. A first and second FETs are configured in a common-gate configuration. The drain of the first FET comprises a first output of the BiFET VCO circuit, while the drain of the second FET comprises a second output of the BiFET VCO circuit.

20 Claims, 2 Drawing Sheets

BIFET VOLTAGE CONTROLLED OSCILLATOR

BACKGROUND OF THE INVENTION

1. Field of the Invention

The present invention is generally in the field of semiconductors. More specifically, the invention is in the field of semiconductor voltage controlled oscillators.

2. Related Art

In the field of wireless communication, such as radio frequency ("RF") communication, data signals are modulated over a carrier signal prior to transmission. Typically, the carrier signal used for RF communication is a sine wave. Thus, an RF signal can generally be represented by the following equation:

$$A\sin(\omega t + \phi) \quad \text{(Equation 1)}$$

where A is the magnitude of the signal, $\omega$ is the frequency of the signal, and $\phi$ is the phase of the signal.

The carrier signal (or sine wave) is generated by an oscillator. For example, a typical oscillator used to generate a sine wave for RF communication is a voltage controlled oscillator ("VCO"). In phase modulation, the data signals are "encoded" into the sine wave by varying the phase component of the sine wave in accordance with the data signals. However, various noise sources can alter the phase component of the sine wave, e.g., by causing fluctuations in the phase. This disturbance upon the phase of the sine wave is commonly referred to as "phase noise." Such phase noise is undesirable because it deteriorates the data signals which are encoded into the sine wave. In some cases, the phase noise becomes intolerable, when, for example, the signal-to-noise ratio ("S/N") becomes so small that demodulation of the data from sine wave signal becomes difficult or impossible.

Three primary sources of phase noise include supply voltage fluctuations, ground fluctuations, and component noise due to thermal variations and/or due to frequency variations ("flicker" noise) in active and passive components. While component noise has been addressed to some degree with current devices employing active and passive components, noise due to supply voltage fluctuations and noise due to ground fluctuations remain as problems which must be addressed in any VCO implementation.

A common disadvantage shared by conventional VCOs is the limited driving capabilities at their output nodes. As a result, complex and expensive buffer circuits connected to the output nodes of conventional VCOs are typically used for driving large loads. Use of such complex and expensive buffer circuits, however, increases manufacturing costs and device size, both of which are undesirable. Another disadvantage with the use of complex buffer circuits in conventional VCOs is the large amount of current drawn by these complex buffer circuits.

Accordingly, there is a need in the art for a voltage controlled oscillator which reduces the effects of noise due to supply voltage fluctuations and ground fluctuations. Furthermore, there is a need in the art for a voltage controlled oscillator capable of driving a large load and having reduced current consumption.

SUMMARY OF THE INVENTION

The present invention is directed to a BiFET voltage controlled oscillator ("VCO"). The invention overcomes the need in the art for a VCO which reduces the effects of noise due to supply voltage fluctuations and to ground fluctuations while also overcoming the need in the art for driving a large load with reduced current consumption.

According to one exemplary embodiment, a BiFET VCO circuit comprises a VCO core circuit, first and second bipolar transistors, and first and second FETs. The VCO core circuit is connected across a first node and a second node. The VCO core circuit may, for example, comprise first and second varactors, and an inductor. The anode of the first varactor is connected to the first node while the anode of the second varactor is connected to the second node, and the cathode of the first varactor is tied to the cathode of the second varactor. A tuning voltage is also connected to the cathode of the first varactor and the cathode of the second varactor. The inductor is connected across the first node and the second node.

The first and second bipolar transistors are configured as a differential pair where the base of the first bipolar transistor is connected to the second node, the collector of the first bipolar transistor is connected to the first node, the base of the second bipolar transistor is connected to the first node, and the collector of the second bipolar transistor is connected to the second node. The emitters of the first and second bipolar transistors are also coupled to ground. The first and second FETs are configured in a common-gate configuration where the gate of the first FET is connected to the gate of the second FET, the source of the first FET is connected to the first node, and the source of the second FET is connected to the second node. A reference voltage is supplied to the gates of the first and second FETs. The drain of the first FET comprises a first output of the BiFET VCO circuit, while the drain of the second FET comprises a second output of the BiFET VCO circuit.

With this configuration, the effects of fluctuations in the supply voltage and fluctuations in the ground upon the operation of BiFET VCO circuit is significantly reduced or eliminated, and thus the voltages at the first and second nodes are stable. Furthermore, each of the first and second outputs generated by BiFET VCO circuit is capable of driving a large load without loading down the voltages at the first and second nodes, further increasing the stability of the first and second nodes. Moreover, the total current drawn by BiFET VCO circuit in operation is significantly reduced over conventional solutions because complex and expensive buffer circuits are not required to drive large loads at the first and second outputs. Other features and advantages of the present invention will become more readily apparent to those of ordinary skill in the art after reviewing the following detailed description and accompanying drawings.

DETAILED DESCRIPTION OF THE INVENTION

The present invention is directed to a BiFET voltage controlled oscillator. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
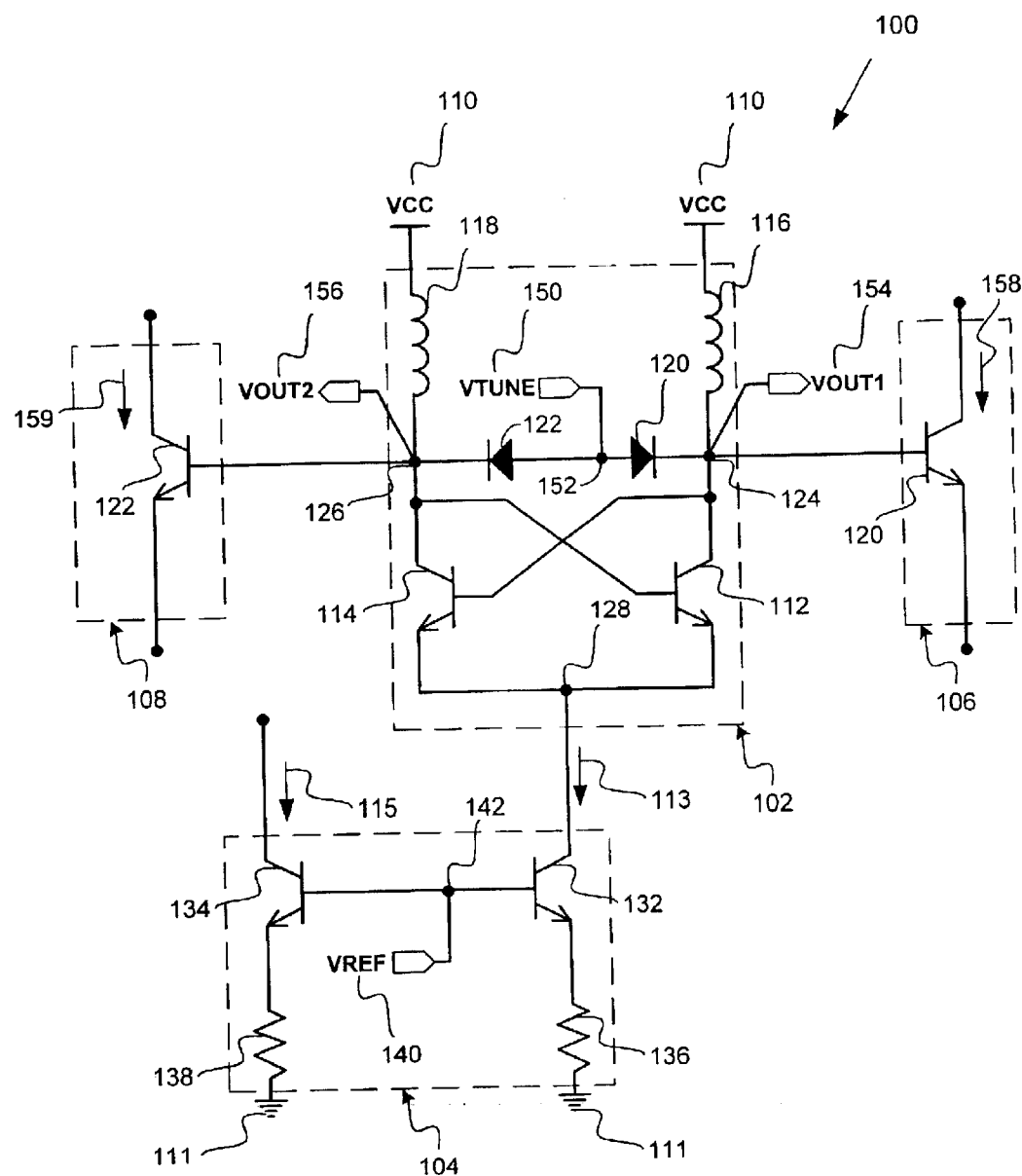
FIG. 1 illustrates a schematic diagram of a known voltage controlled oscillator circuit.

To illustrate the features and advantages of the present invention by way of contrast, a brief description of known voltage controlled oscillator ("VCO") circuit 100 used in RF communication is provided with reference to FIG. 1. FIG. 1 illustrates a schematic diagram of known VCO circuit 100 comprising VCO core circuit 102, current mirror circuit 104, buffer circuit 106 and buffer circuit 108.

VCO core circuit 102 comprises bipolar transistors 112 and 114, inductors 116 and 118, and varactor diodes ("varactors") 120 and 122. VCO core circuit 102 is provided supply voltage ("VCC") 110 and tuning voltage ("VTUNE") 150 and generates output voltage VOUT1 154 at node 124 and output voltage VOUT2 156 at node 126. Bipolar transistor 112 has a base connected to a collector of bipolar transistor 114 at node 126. Bipolar transistor 112 also has a collector connected to a base of bipolar transistor 114 at node 124. Bipolar transistor 112 further has an emitter connected to an emitter of bipolar transistor 114 at node 128.

VCC 110 is connected to one terminal of inductor 116 and to one terminal of inductor 118. Inductors 116 and 118 have their second respective terminals connected to nodes 124 and 126. Anodes of varactors 120 and 122 are connected back-to-back at node 152. VTUNE 150 is supplied to node 152. The cathode of varactor 120 is connected to node 124 while the cathode of varactor 122 is connected to node 126. With this configuration, VCO core circuit 102 is configured to generate an output signal at node 124 (corresponding to VOUT1 154). VCO core circuit 102 also generates an output signal at node 126 (corresponding to VOUT2 156). The frequency of these output signals produced at nodes 124 and 126 are dependent upon the capacitance of varactors 120 and 122, respectively. The capacitance of each varactor 120 and 122 is, in turn, dependent upon the voltage supplied at node 152 by VTUNE 150 and the voltages at nodes 124 and 126, respectively. Thus, it is desirable to maintain stable voltages for VOUT1 154 and VOUT2 156 for purposes of stabilizing the capacitance of each varactor 120 and 122, and hence stabilizing the frequency of the output signals generated by VCO core circuit 102.

In known VCO circuit 100, current mirror circuit 104 is connected to VCO core circuit 102 at node 128. In general, current mirror circuit 104 operates as a current source such that constant current 113 is drawn by current mirror circuit 104 so that the effect of ground fluctuations and supply voltage fluctuations upon the VOUT1 154 and VOUT2 156 are somewhat reduced.

Current mirror circuit 104 comprises bipolar transistor 132 having a base connected to a base of bipolar transistor 134 at node 142. A collector of bipolar transistor 132 is coupled to node 128, while an emitter of bipolar transistor 132 is coupled to ground 111 through resistor 136. An emitter of bipolar transistor 134 is also coupled to ground 111 through resistor 138. Reference voltage ("VREF") 140 is supplied to the base of each bipolar transistor 132 and 134 at node 142 to bias bipolar transistors 132 and 134 and also to assist in maintaining a somewhat constant base-to-emitter voltage ("$V_{BE}$") for each bipolar transistor 132 and 134. As a result of the somewhat constant current 115 in bipolar transistor 134, and the somewhat constant $V_{BE}$ for bipolar transistors 134 and 132, current 113 drawn at the collector of bipolar transistor 132 (from node 128) is substantially constant, i.e. has a substantially constant relation with current 115 provided to the collector of bipolar transistor 134, regardless of any fluctuations at ground 111. With substantially constant current 113 drawn from node 128 of VCO core circuit 102, the operation of VCO core circuit 102 is largely isolated from effects of fluctuations at ground 111. Also as a further result of the substantially constant current 113 drawn from node 128, the effects of fluctuations in VCC 110 upon the operation of VCO core circuit 102 are also significantly reduced.

Nevertheless, due to the particular configuration of known VCO circuit 100, each of VOUT1 154 and VOUT2 156 is incapable of driving a large load, and therefore, VOUT1 154 and VOUT2 156 still remain susceptible to voltage fluctuations under certain circumstances. For example, in the absence of buffer circuits 106, any large load applied to VOUT1 154 would significantly change the voltage at VOUT1 154 and would alter the capacitance of varactor 120. As a consequence, the frequency of the output signal at node 124 is altered, and the output signal at node 124 is significantly impaired. The same problem exists at node 126 with VOUT2 156. In an attempt to address this problem, buffer circuits 106 and 108 are coupled to nodes 124 and 126, respectively, in known VCO circuit 100 to prevent a large load from compromising VOUT1 154 and VOUT2 156, respectively.

However, several drawbacks are associated with buffer circuits 106 and 108 in known VCO circuit 100. First, buffer circuits 106 and 108, although represented in FIG. 1 as transistors 120 and 122 for simplicity, comprise complex circuitry for providing strong driving capabilities and, as a result, increase manufacturing costs and device size of known VCO circuit 100, both of which are undesirable. Second, buffer circuits 106 and 108 increase the total current consumption during operation by drawing additional large amounts of current, e.g., current 158 and 159 through buffer circuits 106 and 108, respectively. Thus, the total current drawn by known VCO circuit 100 is significantly increased due to buffer circuits 106 and 108.

Figure 2:
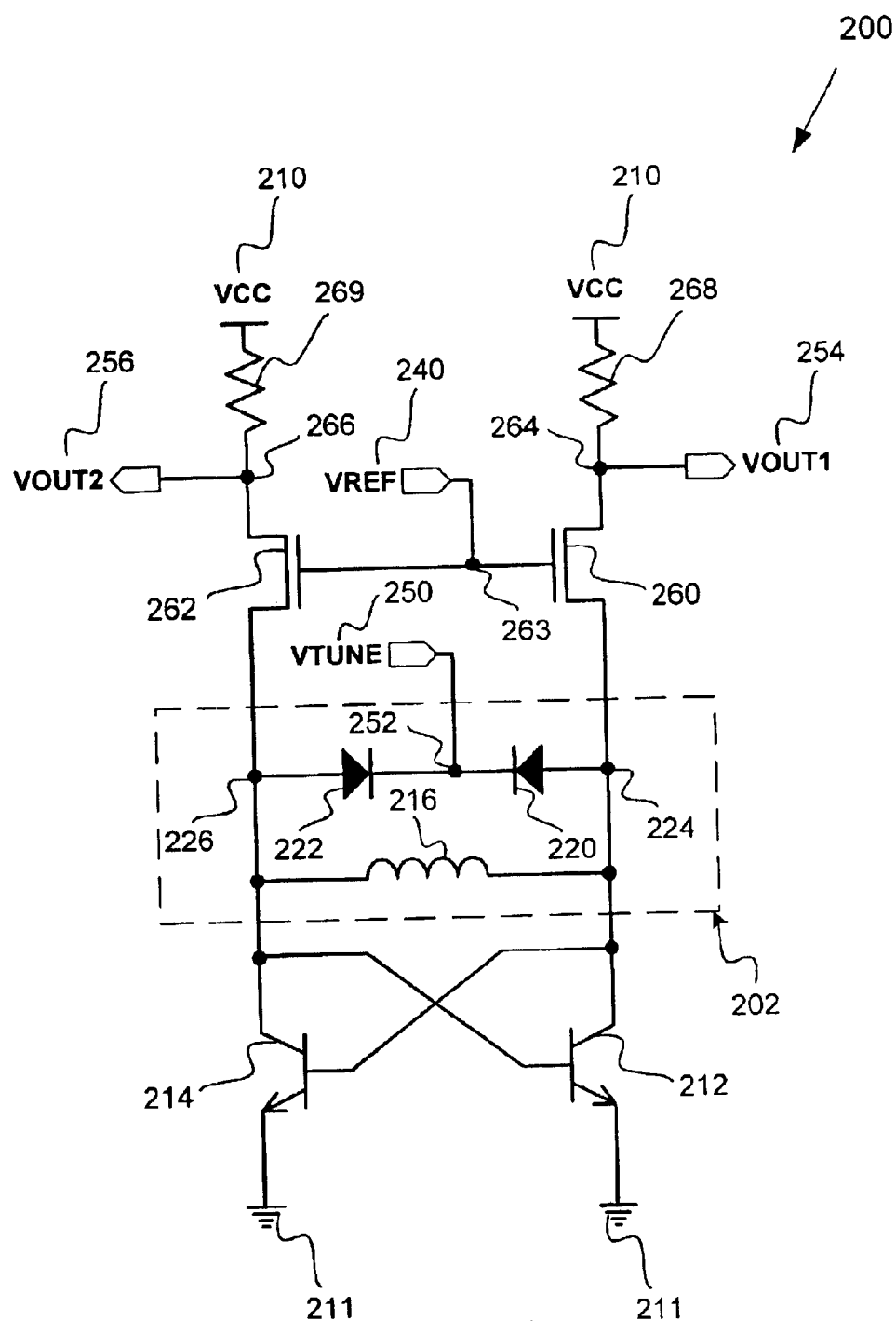
FIG. 2 illustrates a schematic diagram of an exemplary BiFET voltage controlled oscillator circuit in accordance with one embodiment of the present invention.

Referring now to FIG. 2, there is shown a schematic diagram of bipolar-FET ("BiFET") voltage controlled oscillator ("VCO") circuit 200 in accordance with one embodiment of the present invention. By way of example, BiFET VCO circuit 200 may be utilized in an RF module (not shown) for generating sine wave signals for RF communication. BiFET VCO circuit 200 is supplied supply voltage ("VCC") 210, reference voltage ("VREF") 240, and tuning voltage ("VTUNE") 250 and generates output voltage VOUT1 254 at node 264 and output voltage VOUT2 256 at node 266. As described below, due to the particular configuration of BiFET VCO circuit 200, the effects of supply voltage fluctuations and ground fluctuations upon the operation of BiFET VCO circuit 200 are significantly reduced or eliminated. Furthermore, output voltages, VOUT1 254 and VOUT2 256, generated by BiFET VCO circuit 200 are capable of driving a large load with reduced current consumption.

In the present exemplary embodiment shown in FIG. 2, BiFET VCO circuit 200 comprises VCO core circuit 202, bipolar transistors 212 and 214, and n-channel FETs (NFETs) 260 and 262. VCO core circuit 202 comprises varactors 220 and 222, where the cathodes of varactor 220 and 222 are tied together at node 252. VTUNE 250 is supplied to node 252. The anode of varactor 220 is connected to node 224, and the anode of varactor 222 is connected to node 226. In the particular embodiment shown in FIG. 2, the voltage supplied at node 252 by VTUNE 250 is greater than the voltages at nodes 224 and 226 so that varactors 220 and 222 are reverse-biased and operate as capacitors. The capacitance of varactors 220 and 222, and hence the frequency of the signal output of BiFET VCO circuit 200, are dependent upon the magnitude of the voltage supplied by VTUNE 250 at node 252 and the voltages at nodes 224 and 226, respectively. It is noted that in the present application varactors 220 and 222 are also referred to as "variable capacitive means." VCO core circuit 202 further includes inductor 216 connected across node 224 and node 226. Inductor 216 can be any "inductive means" such as an electronic inductor as well as a conventional inductor as shown in FIG. 2.

Bipolar transistor 212 and 214 are configured as a differential pair, where the base of bipolar transistor 212 is connected to the collector of bipolar transistor 214 at node 226; the collector of bipolar transistor 212 is connected to the base of bipolar transistor. 214 at node 224; and the emitter of bipolar transistor 212 and the emitter of bipolar transistor 214 are each connected to a reference voltage such as ground 211.

The gate of NFET 260 is coupled to the gate of NFET 262 at node 263 in a common-gate configuration. VREF 240 provides a stable and constant bias and reference voltage which is supplied to the gates of NFETS 260 and 262 at node 263 and, thus, the gate voltage ($V_G$) of each NFET 260 and 262 is constant. The source of NFET 260 is connected to node 224, and the source of NFET 262 is connected to node 226. One terminal of resistor 268 is coupled to VCC 210 while the other terminal of resistor 268 is coupled to the drain of NFET 260. Similarly, one terminal of resistor 269 is coupled to VCC 210 while the other terminal of resistor 269 is coupled to the drain of NFET 262. In the present exemplary embodiment, VCC 210 provides a supply voltage of approximately 3 V.

Due to the high impedance at each drain of NFET 260 and 262 and due to the common gate configuration of NFET 260 and 262 and since a constant $V_G$ is supplied to each gate of NFET 260 and 262 by VREF 240, any fluctuations in VCC 210 will have little or no impact upon the current through NFETs 260 and 262, and therefore the voltages at the source of each NFET 260 and 262 (corresponding to nodes 224 and 226, respectively) will remain substantially constant and stable. Moreover, as a further result of the constant current drawn through each NFET 260 and 262, the effects of fluctuations in ground 211 upon the operation of VCO core circuit 202 are also significantly reduced. Thus, the effects of fluctuations in VCC 210 and fluctuations in ground 211 upon nodes 224 and 226 are significantly reduced or eliminated due to the configuration of BiFET VCO circuit 200.

According to the exemplary embodiment of the invention shown in FIG. 2, VOUT2 254 is generated at node 264 connected to the drain of NFET 260, and VOUT2 256 is generated at node 266 connected to the drain of NFET 262. With this configuration, BiFET VCO circuit 200 achieves stable voltages at nodes 224 and 226 of VCO core circuit 202 while providing strong driving capabilities at VOUT1 254 and VOUT2 256. This benefit is achieved because the voltages at nodes 224 and 226 of VCO core circuit 202 are amplified by NFETS 260 and 262, respectively, for generating VOUT1 254 and VOUT2 256, respectively. Therefore, due to the configuration of BiFET VCO circuit 200, each of VOUT1 254 and VOUT2 256 is capable of driving a large load, and yet the voltages at nodes 224 and 226 of VCO core circuit 202 remain substantially stable and are not loaded down. Furthermore, with sufficient driving capabilities provided at VOUT1 254 and VOUT2 256, the need for complex and expensive buffer circuits no longer exists. Instead, less complex and less expensive buffer circuits may be used at VOUT1 254 and VOUT2 256 or, in some cases, the driving capabilities at VOUT1 254 and VOUT2 256 are sufficiently strong such that buffer circuits are not required altogether at VOUT1 254 and VOUT2 256.

Moreover, according to the present embodiment, since the need for complex buffer circuits have been eliminated or greatly reduced, the total current drawn by BiFET VCO circuit 200 is likewise reduced. The reason is that, with the complex buffer circuits eliminated or reduced, the large current normally drawn through these complex buffer circuits are likewise eliminated or greatly reduced. Instead, the current drawn through each NFETs 260 and 262 has sufficient drive capabilities for driving a large load connected to nodes 264 and 266, respectively. With the large current drawn by the complex buffer circuits eliminated or greatly reduced, the total current drawn by BiFET VCO circuit 200 is therefore significantly reduced.

In sum, due to the configuration of BiFET VCO circuit 200, the effects of VCC 210 fluctuations and ground 211 fluctuations upon the operation of BiFET VCO circuit 200 are significantly reduced or eliminated while the voltages at nodes 224 and 226 of VCO core circuit 202 are stable. As a result, capacitance of varactors 220 and 222 remain stable, and the frequency of the output signal produced by BiFET VCO circuit 200 is also stable. As described above, each of VOUT1 254 and VOUT2 256 generated by BiFET VCO circuit 200 is further capable of driving a large load without loading down nodes 224 and 226, therefore, further increasing the stability of nodes 224 and 226. Moreover, these benefits are achieved while the total current drawn by BiFET VCO circuit 200 has been significantly reduced since complex and expensive buffer circuits are not required to drive large loads at each of VOUT1 254 and VOUT2 256.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a BiFET voltage controlled oscillator has been described.

What is claimed is:

1. A circuit comprising:
   a first varactor having a first anode and a first cathode, said first anode connected to a first node;
   a second varactor having a second anode and a second cathode, said second anode connected to a second node, said second cathode of said second varactor connected to said first cathode of said first varactor;

an inductor connected across said first node and said second node;

a first bipolar transistor having a first base, a first emitter, and a first collector, said first base connected to said second node, said first collector connected to said first node;

a second bipolar transistor having a second base, a second emitter, and a second collector, said second base connected to said first node, said second collector connected to said second node;

a first FET having a first gate, a first drain, and a first source, said first source connected to said first node, said first drain comprising a first output of said circuit;

a second FET having a second gate, a second drain, and a second source, said second source connected to said second node, said second gate connected to said first gate, said second drain comprising a second output of said circuit.

2. The circuit of claim 1, wherein said first gate of said first FET and said second gate of said second FET are connected to a reference voltage.

3. The circuit of claim 1, wherein said first drain of said first FET is further connected to a supply voltage through a first resistor.

4. The circuit of claim 3, wherein said second drain of said second FET is further connected to said supply voltage through a second resistor.

5. The circuit of claim 1, wherein each of said first FET and said second FET is an NFET.

6. The circuit of claim 1, wherein said first cathode of said first varactor and said second cathode of said second varactor are connected to a tuning voltage.

7. The circuit of claim 6, wherein said tuning voltage is greater than a first node voltage at said first node, and said tuning voltage is greater than a second node voltage at said second node.

8. The circuit of claim 1, wherein said first emitter of said first bipolar transistor and second emitter of said second bipolar transistor are connected to a reference voltage.

9. The circuit of claim 8, wherein said reference voltage is a ground voltage.

10. A BiFET VCO circuit comprising:

a VCO core circuit connected across a first node and a second node;

a first bipolar transistor having a first base, a first emitter, and a first collector, said first base connected to said second node, said first collector connected to said first node;

a second bipolar transistor having a second base, a second emitter, and a second collector, said second base connected to said first node, said second collector connected to said second node;

a first FET having a first gate, a first drain, and a first source, said first source connected to said first node, said first drain comprising a first output of said BiFET VCO circuit;

a second FET having a second gate, a second drain, and a second source, said second source connected to said second node, said second gate connected to said first gate, said second drain comprising a second output of said BiFET VCO circuit.

11. The BiFET VCO circuit of claim 10, wherein said first gate of said first FET and said second gate of said second FET are connected to a reference voltage.

12. The BiFET VCO circuit of claim 10, wherein said first drain of said first FET is further connected to a supply voltage through a first resistor.

13. The BiFET VCO circuit of claim 12, wherein said second drain of said second FET is further connected to said supply voltage through a second resistor.

14. The BiFET VCO circuit of claim 10, wherein each of said first FET and said second FET is an NFET.

15. The BiFET VCO circuit of claim 10, wherein said VCO core circuit comprises:

a first varactor having a first anode and a first cathode, said first anode connected to said first node;

a second varactor having a second anode and a second cathode, said second anode connected to said second node, said second cathode of said second varactor connected to said first cathode of said first varactor;

an inductor connected across said first node and said second node.

16. The BiFET VCO circuit of claim 15, wherein said first cathode of said first varactor and said second cathode of said second varactor are connected to a tuning voltage.

17. The BiFET VCO circuit of claim 16, wherein said tuning voltage is greater than a first node voltage at said first node, and said tuning voltage is greater than a second node voltage at said second node.

18. A circuit comprising:

first variable capacitive means having a first terminal and a second terminal, said first terminal connected to a first node;

second variable capacitive means having a third terminal and a fourth terminal, said third terminal connected to a second node, said fourth terminal connected to said second terminal;

inductive means connected across said first node and said second node;

a first bipolar transistor, said first bipolar transistor having a first base, a first emitter and a first collector, said first base connected to said second node, said first collector connected to said first node;

a second bipolar transistor, said second bipolar transistor having a second base, a second emitter and a second collector, said second base connected to said first node, said second collector connected to said second node;

a first FET, said first FET having a first gate, a first drain, and a first source, said first source connected to said first node, said first drain comprising a first output of said circuit; and a second FET, said second FET having a second gate, a second drain, and a second source, said second source connected to said second node, said second gate connected to said first gate, said second drain comprising a second output of said circuit.

19. The circuit of claim 18, wherein said first gate of said first FET and said second gate of said second FET are connected to a reference voltage.

20. The circuit of claim 18, wherein said first drain of said first FET is further connected to a supply voltage through a first resistor, and said second drain of said second FET is further connected to said supply voltage through a second resistor.

* * * * *